United States Patent
Pandey et al.

(10) Patent No.: US 12,117,734 B2
(45) Date of Patent: Oct. 15, 2024

(54) METROLOGY METHOD AND DEVICE FOR DETERMINING A COMPLEX-VALUED FIELD

(71) Applicant: ASML Netherlands B.V., Veldhoven (NL)

(72) Inventors: Nitesh Pandey, Silicon Valley (CA); Alexander Prasetya Konijnenberg, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 108 days.

(21) Appl. No.: 17/638,975

(22) PCT Filed: Jul. 31, 2020

(86) PCT No.: PCT/EP2020/071666
§ 371 (c)(1),
(2) Date: Feb. 28, 2022

(87) PCT Pub. No.: WO2021/043514
PCT Pub. Date: Mar. 11, 2021

(65) Prior Publication Data
US 2022/0299886 A1     Sep. 22, 2022

(30) Foreign Application Priority Data
Sep. 2, 2019  (EP) ................................. 19194973

(51) Int. Cl.
*G03F 7/00*   (2006.01)
*G01N 21/47*  (2006.01)

(52) U.S. Cl.
CPC ..... *G03F 7/70633* (2013.01); *G01N 21/4738* (2013.01)

(58) Field of Classification Search
CPC .. G01N 21/4738; G03F 7/705; G03F 7/70633
See application file for complete search history.

(56) References Cited

U.S. PATENT DOCUMENTS

| | | |
|---|---|---|
| 6,952,253 B2 | 10/2005 | Lof et al. |
| 7,701,577 B2 | 4/2010 | Straaijer et al. |
| (Continued) | | |

FOREIGN PATENT DOCUMENTS

| | | |
|---|---|---|
| EP | 1 628 164 A2 | 2/2006 |
| EP | 3 480 554 A1 | 5/2019 |
| (Continued) | | |

OTHER PUBLICATIONS

International Search Report and Written Opinion of the International Searching Authority directed to related International Patent Application No. PCT/EP2020/071666, mailed Oct. 27, 2020; 9 pages.

*Primary Examiner* — Deoram Persaud
(74) *Attorney, Agent, or Firm* — Sterne, Kessler, Goldstein & Fox P.L.L.C.

(57) ABSTRACT

Disclosed is a method of measuring a structure, and associated metrology device and computer program. The method comprises obtaining an amplitude profile of scattered radiation relating to a measurement of a first structure on a first substrate and obtaining a reference phase profile relating to a reference measurement of at least one reference structure on a reference substrate. The at least one reference structure is not the same structure as said first structure but is nominally identical in terms of at least a plurality of key parameters. The method further comprises determining a complex-valued field to describe the first structure from the amplitude profile and reference phase profile.

15 Claims, 5 Drawing Sheets

(56) References Cited

U.S. PATENT DOCUMENTS

| | | |
|---|---|---|
| 7,791,724 B2 | 9/2010 | Den Boef et al. |
| 8,115,926 B2 | 2/2012 | Straaijer |
| 8,553,227 B2 | 10/2013 | Jordanoska |
| 8,681,312 B2 | 3/2014 | Straaijer |
| 8,692,994 B2 | 4/2014 | Straaijer |
| 8,792,096 B2 | 7/2014 | Straaijer |
| 8,797,554 B2 | 8/2014 | Straaijer |
| 8,823,922 B2 | 9/2014 | Den Boef |
| 9,939,742 B2 * | 4/2018 | Tinnemans ............ G03F 9/7069 |
| 2010/0328655 A1 | 12/2010 | Den Boef |
| 2011/0026032 A1 | 2/2011 | Den Boef et al. |
| 2011/0102753 A1 | 5/2011 | Van De Kerkhof et al. |
| 2011/0249244 A1 | 10/2011 | Leewis et al. |
| 2012/0044470 A1 | 2/2012 | Smilde et al. |
| 2013/0162996 A1 | 6/2013 | Straaijer et al. |
| 2016/0011523 A1 * | 1/2016 | Singh ................. G01N 21/4788 355/77 |
| 2016/0061750 A1 * | 3/2016 | Den Boef ............ G03H 1/0443 356/496 |
| 2016/0161863 A1 | 6/2016 | Den Boef et al. |
| 2016/0370717 A1 | 12/2016 | Den Boef et al. |
| 2017/0031246 A1 | 2/2017 | Den Boef |
| 2017/0322497 A1 * | 11/2017 | Lin .......................... G21K 5/04 |
| 2018/0107124 A1 * | 4/2018 | Tukker ................. G01N 21/956 |
| 2019/0107781 A1 | 4/2019 | Tinnemans et al. |
| 2019/0235391 A1 * | 8/2019 | Bijnen ............... G03F 7/70425 |
| 2019/0265028 A1 * | 8/2019 | Tinnemans ........... G03F 7/7065 |
| 2022/0299888 A1 * | 9/2022 | Konijnenberg ....... G03F 7/7065 |
| 2022/0309645 A1 * | 9/2022 | Tenner ............... G01N 21/8851 |
| 2022/0334497 A1 * | 10/2022 | Pandey ............... G03F 7/70625 |
| 2023/0004096 A1 * | 1/2023 | Middlebrooks ........ G06N 3/047 |
| 2023/0064193 A1 * | 3/2023 | Tinnemans ............... G06T 5/80 |

FOREIGN PATENT DOCUMENTS

| | | |
|---|---|---|
| EP | 3 531 191 A1 | 8/2019 |
| EP | 3 754 427 A1 | 12/2020 |
| EP | 3 783 439 A1 | 2/2021 |
| WO | WO 2011/012624 A1 | 2/2011 |
| WO | WO 2019/068459 A1 | 4/2019 |
| WO | WO 2019/166190 A1 | 9/2019 |
| WO | WO 2019/197117 A1 | 10/2019 |

* cited by examiner

METROLOGY METHOD AND DEVICE FOR DETERMINING A COMPLEX-VALUED FIELD

CROSS REFERENCE TO RELATED APPLICATIONS

This application claims priority of EP application 19194973.4 which was filed on 2019 Sep. 2 and which is incorporated herein in its entirety by reference.

FIELD

The present invention relates to a metrology method and device for determining a characteristic of structures on a substrate.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable to make frequently measurements of the structures created, e.g., for process control and verification. Various tools for making such measurements are known, including scanning electron microscopes or various forms of metrology apparatuses, such as scatterometers. A general term to refer to such tools may be metrology apparatuses or inspection apparatuses.

A metrology device may use computationally retrieved phase to apply aberration correction to an image captured by the metrology device. One method described, for the calculation of phase, uses multiple diverse images, such as multiple images of the same target under different focus conditions. This typically requires mechanical movement of the sample (e.g., target), and multiple images captures which has a high time cost.

SUMMARY

It is desirable to reduce acquisition time and increase throughput when performing a phase retrieval in a metrology application.

Embodiments of the invention are disclosed in the claims and in the detailed description.

In a first aspect of the invention there is provided a method of measuring a structure comprising: obtaining an amplitude profile of scattered radiation relating to a measurement of a first structure on a first substrate; obtaining a reference phase profile relating to a reference measurement of at least one reference structure on a reference substrate, said at least one reference structure not being the same structure as said first structure; the at least one reference structure and the first structure being nominally identical in terms of at least a plurality of key parameters; and determining a complex-valued field to describe the first structure from the amplitude profile and reference phase profile.

Other aspects of the invention include a computer program comprising program instructions operable to perform the method of the first aspect, a non-transient computer program carrier comprising said computer program, a processing device operable to run said computer program, a metrology device being operable to perform the method of the first aspect and a lithographic cell comprising such a metrology device.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
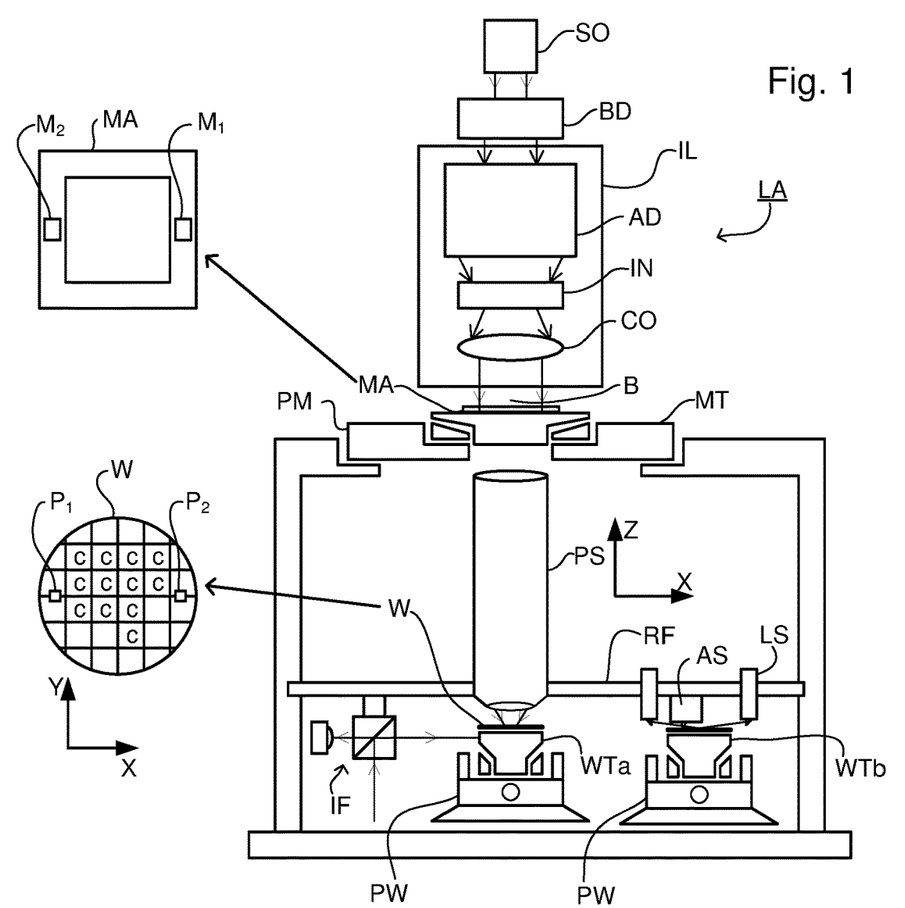
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
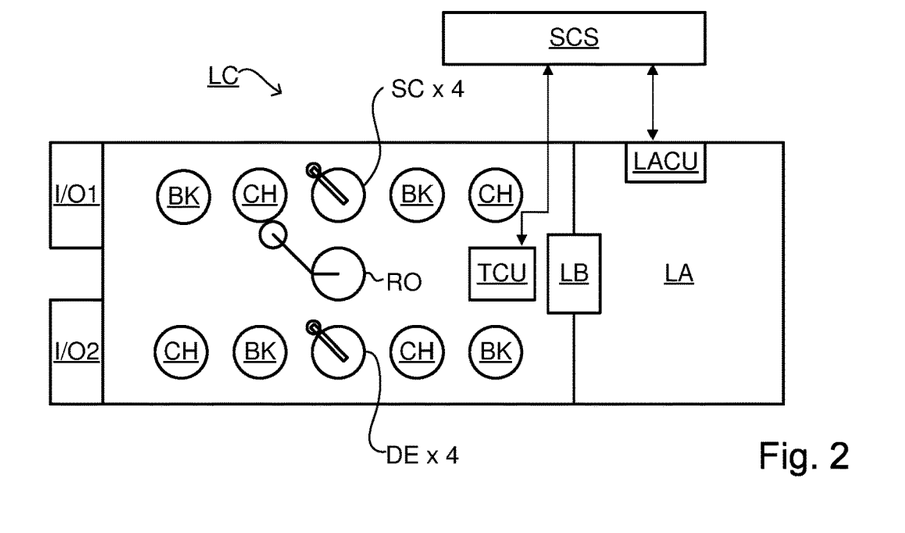
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
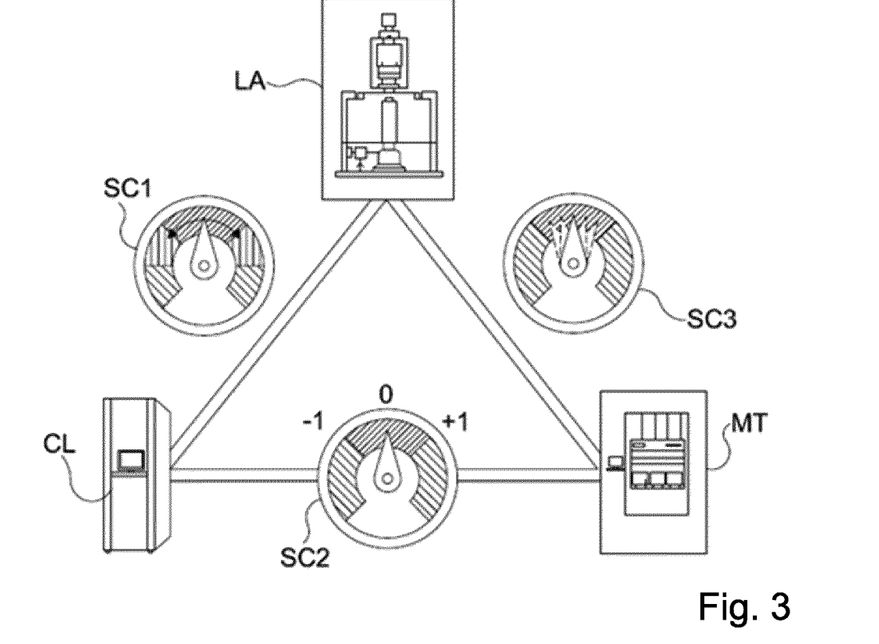
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MET (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating can be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers can measure in one image multiple targets from from multiple gratings using light from soft x-ray and visible to near-IR wave range.

Figure 4:
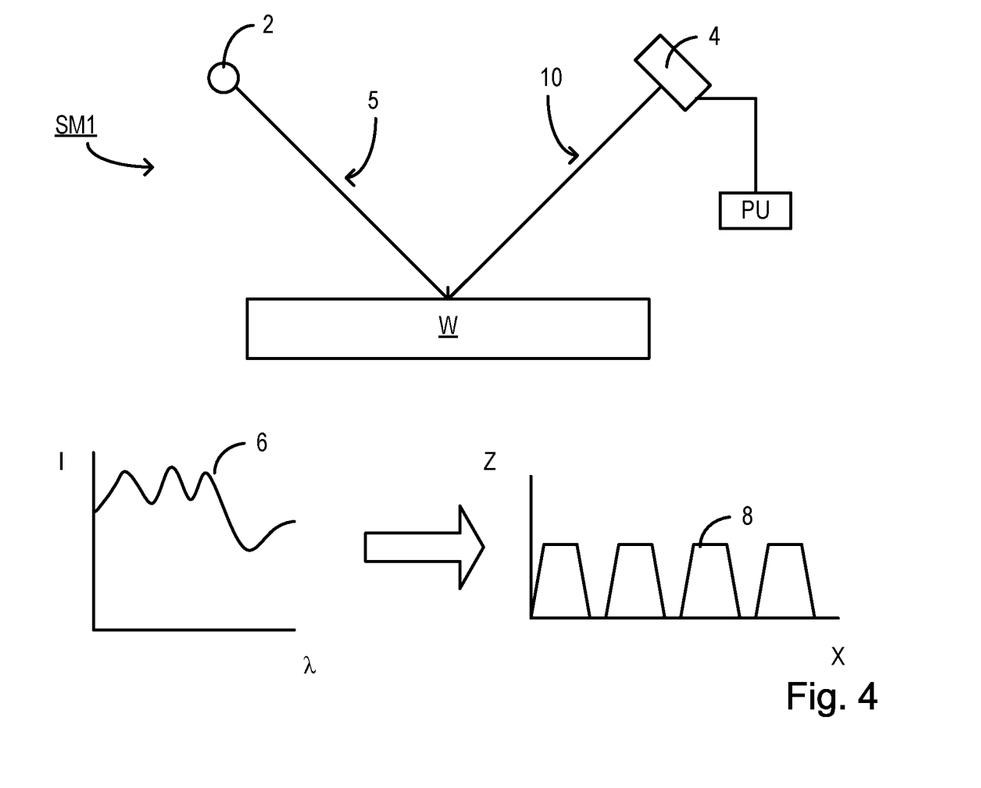
FIG. 4 is a schematic illustration of a scatterometry apparatus.

A metrology apparatus, such as a scatterometer, is depicted in FIG. 4. It comprises a broadband (white light) radiation projector 2 which projects radiation 5 onto a substrate W. The reflected or scattered radiation 10 is passed to a spectrometer detector 4, which measures a spectrum 6 (i.e. a measurement of intensity I as a function of wavelength $\lambda$) of the specular reflected radiation 10. From this data, the structure or profile 8 giving rise to the detected spectrum may be reconstructed by processing unit PU, e.g. by Rigorous Coupled Wave Analysis and non-linear regression or by comparison with a library of simulated spectra. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922,587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resembles the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety A metrology apparatus which employs a computational imaging/phase retrieval approach has been described in US patent publication US2019/0107781, which is incorporated herein by reference. Such a metrology device may use relatively simple sensor optics with unexceptional or even relatively mediocre aberration performance. As such, the sensor optics may be allowed to have aberrations, and therefore produce a relatively aberrated image. Of course, simply allowing larger aberrations within the sensor optics will have an unacceptable impact on the image quality unless something is done to compensate for the effect of these optical aberrations. Therefore, computational imaging techniques are used to compensate for the negative effect of relaxation on aberration performance within the sensor optics.

In such an approach, the intensity and phase of the target is retrieved from one or multiple intensity measurements of the target. The phase retrieval may use prior information of the metrology target (e.g., for inclusion in a loss function that forms the starting point to derive/design the phase retrieval algorithm). Alternatively, or in combination with the prior information approach, diversity measurements may be made. To achieve diversity, the imaging system is slightly altered between the measurements. An example of a diversity measurement is through-focus stepping, i.e., by obtaining measurements at different focus positions. Alternative methods for introducing diversity include, for example, using different illumination wavelengths or a different wavelength range, modulating the illumination, or changing the angle of incidence of the illumination on the target between measurements. The phase retrieval itself may be based on that described in the aforementioned US2019/0107781, or in patent application EP17199764 (also incorporated herein by reference). This describes determining from an intensity measurement, a corresponding phase retrieval such that interaction of the target and the illumination radiation is described in terms of its electric field or complex-valued field ("complex" here meaning that both amplitude and phase information is present). The intensity measurement may be of lower quality than that used in conventional metrology, and therefore may be out-of-focus as described. The described interaction may comprise a representation of the electric and/or magnetic field immediately above the target. In such an embodiment, the illuminated target electric and/or magnetic field image is modelled as an equivalent source description by means of infinitesimal electric and/or magnetic current dipoles on a (e.g., two-dimensional) surface in a plane parallel with the target. Such a plane may, for example be a plane immediately above the target, e.g., a plane which is in focus according to the Rayleigh criterion, although the location of the model plane is not critical: once amplitude and phase at one plane are known, they can be computationally propagated to any other plane (in focus, out of focus, or even the pupil plane). Alternatively, the description may comprise a complex transmission of the target or a two-dimensional equivalent thereof.

The phase retrieval may comprise modeling the effect of interaction between the illumination radiation and the target on the diffracted radiation to obtain a modelled intensity pattern; and optimizing the phase and amplitude of the electric field/complex-valued field within the model so as to minimize the difference between the modelled intensity pattern and the detected intensity pattern. More specifically, during a measurement acquisition, an image (e.g., of a target) is captured on detector (at a detection plane) and its intensity measured. A phase retrieval algorithm is used to determine the amplitude and phase of the electric field at a plane for example parallel with the target (e.g., immediately above the target). The phase retrieval algorithm uses a forward model of the sensor (e.g. aberrations are taken into account), to computationally image the target to obtain modelled values for intensity and phase of the field at the detection plane. No target model is required. The difference between the modelled intensity values and detected intensity values is minimized in terms of phase and amplitude (e.g., iteratively) and the resultant corresponding modelled phase value is deemed to be the retrieved phase. Specific methods for using the complex-valued field in metrology applications are described in PCT application PCT/EP2019/052658, also incorporated herein by reference.

Performing measurements sequentially at multiple focus levels takes significant time. Obtaining stepwise defocused images is therefore slow, resulting in a slow measurement speed and low throughput. A simple calculation demonstrates this. Assuming that 5 through-focus images are taken for each combination of 4 directions and 5 (sequentially captured) wavelengths, and each image takes 1ms to capture, it will take about 100 ms to measure each target. This does not include the time taken for moving the stages and switching wavelengths. In addition, the phase retrieval calculation (which is typically iterative) itself can be computationally intensive and take a long time to converge to a solution.

Therefore it is proposed that the iterative phase retrieval is performed once for a reference measurement on one or a few reference targets, and the resultant reference phase profile used to determine the complex-valued field in a production setting. Such an approach may be considered to be a 'phase transplant' technique in which only one aberrated image is acquired and, rather than performing a phase retrieval for a measurement of each individual target, it is proposed that the target phase profile is "transplanted" or inferred from an earlier reference phase measurement of one or more reference targets. The reference targets should be nominally similar or identical to each other and the targets which are to be measured in the production phase, at least in terms of key parameters (e.g., such as pitch, grating size, grating orientation, composition) and measured under the same essential measurement/illumination conditions. As such, the reference phase measurement may comprise yield a pre-calculated and stored reference phase profile or phase template. This pre-calculated phase template may be modified and attached to the measured target amplitude to determine a 'semi-synthetic' complex-valued field distribution; this can then be corrected for the aberrations from the optical system (e.g., based on knowledge of the sensor aberrations). Overlay or other parameter of interest can then be measured from the corrected image.

The reference phase profile or phase template may be obtained by performing a phase retrieval in advance on at least one reference target, based on more conventional phase retrieval techniques, such as through-focus stepping (and/or multiple captures with another parameter varied). A number of suitable phase retrieval techniques are described in WO2019/068459 (in particular in the section therein headed "Example phase retrieval algorithm"), which is herein incorporated by reference. The phase template used may be based on a single phase retrieval, or optionally an averaged phase profile retrieved from a few similar targets, having been performed in advance and stored. In an embodiment, more than one nominally similar (in at least a number of key parameters) targets are measured, and the results averaged, to determine the phase template. The nominally similar targets may be targets designed to be identical (at least in terms of the key parameters), ignoring unplanned or undesired variation; e.g., due to imaging effects or undesired overlay error (as opposed to deliberate biases). As each die is typically nominally identical, nominally identical targets should be exposed at numerous locations over the substrate. It is proposed therefore, that only a few of these targets are measured and averaged over in this phase template creation step. The number of targets selected for this step may be fewer than 50, fewer than 20, fewer than 10 or fewer than 6 for example.

The phase template can then be used for use on all complex-valued field determinations of a target in, for example, a production setting where throughput optimization is important. During a measurement of a parameter of interest (e.g., an overlay measurement), a single intensity image (e.g., of a single diffraction order) is captured, e.g., for a given measurement condition. The corresponding amplitude profile (a spatial description of field amplitude relating to the target) at the detector plane may be directly obtained, e.g., by a square root operation on the intensity profile captured. The phase template or reference phase profile may be combined with the amplitude profile (e.g., aligned and added), such that a complex-valued field profile (e.g., spatial description of the complex-valued field) for the target is determined.

Figure 5:
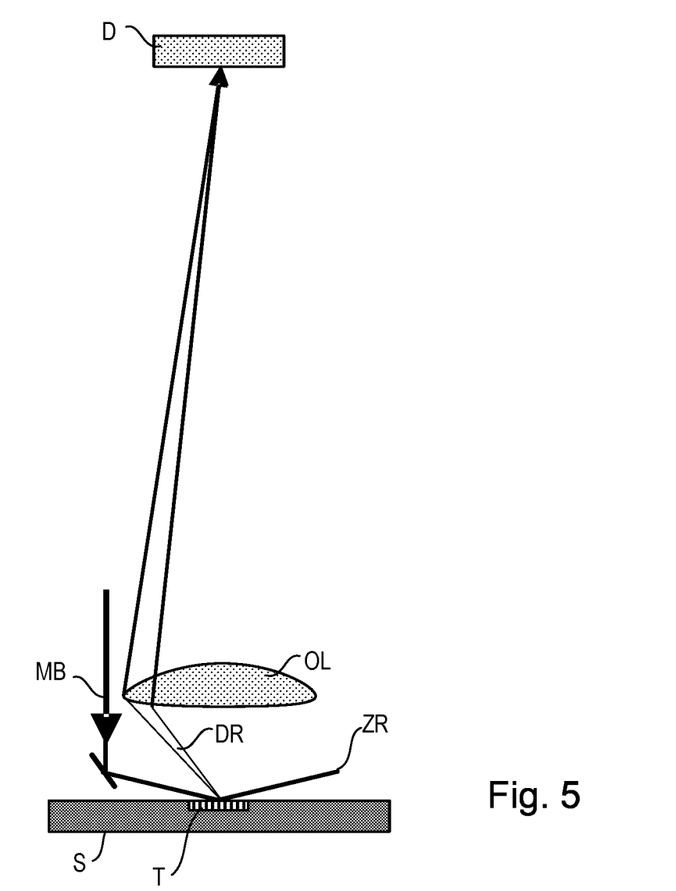
FIG. 5 illustrates a measurement arrangement usable in performing a method according to an embodiment of the invention.

FIG. 5 illustrates a metrology arrangement according to an embodiment. The arrangement is largely similar to those described in the aforementioned documents US2019/0107781 and PCT/EP2019/05265, which makes use of computational phase retrieval techniques to correct for a simpler, aberrated lens design. In FIG. 5, the highly simplified schematic diagram shows a measurement beam MB of radiation (e.g., from a source, not shown) directed onto a target T on a substrate S. Higher order diffracted radiation DR is captured by objective lens OL and directed to a detector D. The zeroth order radiation ZR is not captured, and as such the captured image is a darkfield image.

Figure 6:
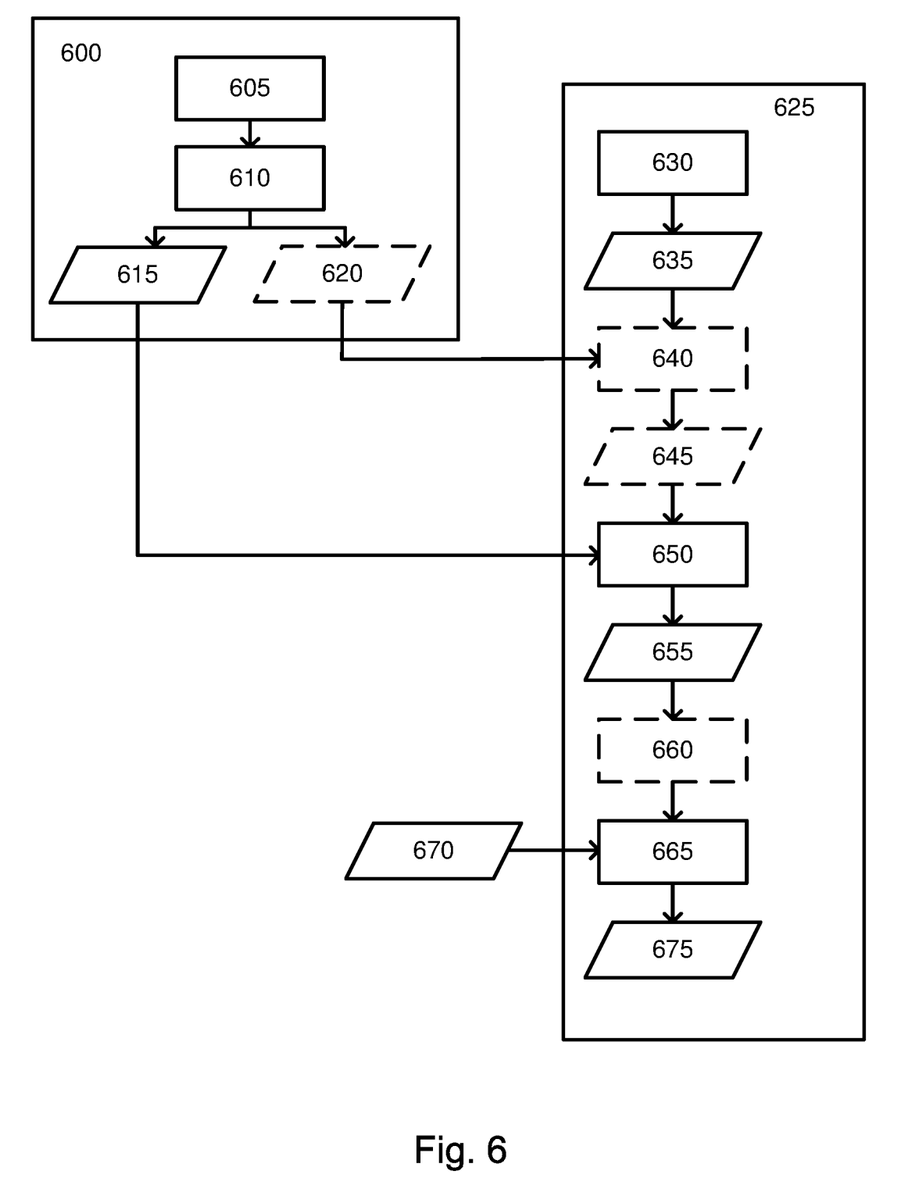
FIG. 6 is a flowchart describing a method according to an embodiment of the invention.

FIG. 6 is a flowchart describing a proposed method. In an initial reference phase 600, one or more reference targets are selected 605 from a test wafer. In an embodiment, a few different (though nominally identical) reference targets may be selected for averaging any phase errors. In another embodiment targets on a fiducial may be selected. The reference targets should having the same key parameters and properties as the targets which are to be formed for metrology purposes and to which the phase measurements will be transplanted. A reference measurement step 610 comprises measuring the reference target(s) and retrieving phase using a phase retrieval technique e.g., using a standard approach such through-focus stepping. This measurement step is performed at one or more desired wavelengths and illumination conditions which correspond to those which will be used in the production phase 625. The (e.g., average) reference phase profile obtained from measurement step 610 is stored as the phase template 615. Optionally an equivalent reference amplitude profile or amplitude template 620 may be determined and stored. This amplitude template 620 may comprise the square root of the detected intensity profile obtained in measurement step 610; and may also comprise an average amplitude profile for the selected reference targets, when more than one. The amplitude template 620 and phase template 615 can be used in combination as a reference complex field template.

In a production phase 625, an overlay measurement is performed 630 during which a single intensity image of the target is measured (at least for a given measurement condition such as a wavelength, polarization and/or measurement direction). From the intensity image, an amplitude profile 635 is obtained (e.g., by a square root operation).

In practice, in a production setting, the target from which the amplitude template 635 is derived may not necessarily be at the same focus location and/or not in the same planar location with respect to the image sensor as that of the reference target from which the reference complex field template or reference phase template was created. Therefore, in an optional alignment step 640, the amplitude profile 635 is aligned, e.g., with sub-pixel accuracy in 3 dimensions, with the amplitude template 620 to obtain a registered amplitude template 645. In order to align in the z-direction (focus), step 640 may comprise defocusing the reference complex field or reference amplitude field numerically and comparing the intensity at different focus offsets with the measured image. The defocus value is fixed at the value corresponding to when the images best match (for example, according to an image correlation metric). The defocused reference field can then be shifted in x and y directions and the images aligned with sub-pixel accuracy. These steps help ensure that targets measured at different locations are properly aligned (e.g., in all 3 dimensions) with the phase template at the next step 650.

A complex-valued field determination step 650 may comprise combining the phase template 615 to the registered amplitude template 645, to determine the complex-valued field 655 for the target. However, where step 640 is omitted, the phase template 615 may be applied directly to the amplitude profile 635 to determine the complex-valued field 655.

Optional step 660 may comprise performing an adjustment for overlay induced global phase offset. The global phase offset is an overlay dependent phase offset over the entire field. In conventional situations, the global phase offset does not need to be known to reconstruct the images as it does not carry any information about the shape (phase variation) within the images. But in situation where the aberrations are so severe that images overlap (e.g., overlap of the positive and negative bias pad images overlap with each other), then the global phase offset can be treated as a variable which can be mathematically tuned (e.g., prior to or during the next step) so as to maximize the quality of the corrected image. Such severe aberrations are not typical, however, so this step may not be necessary.

At step 665, lens aberrations (e.g., aberrations due to imperfections in the sensor optics) in the complex-valued field 655 are corrected. This may comprise Fourier transforming the complex-valued field 655 to obtain a description of the corresponding pupil plane. The lens aberration phase profile 670 can then be conjugated and multiplied with the Fourier transformed complex-valued field. Optionally, the defocus aberration may be digitally adjusted so as to maximize image quality in a corrected image or corrected complex-valued field description 675. Note that defocus aberration is an aberration resulting from the wafer stage being not at the correct focus of the lens. It is a controllable and user induced aberration. It is distinct from the lens aberration phase profile is the aberration inherent in the imperfect lens. It is fixed and not user controllable.

The targets measured on a wafer should be all nominally identical in at least key parameters, which include pitch, grating size and grating orientation, to the reference target(s). They should also be measured under identical illumination conditions (e.g., wavelength, illumination angle, polarization, illumination profile etc.). A narrow illumination numerical aperture NA may preferably be used and a single diffracted order is collected such that the $1^{st}$ order scattering from the (e.g., μDBO) targets can be accurately approximated as isolated square apertures. While the optical system is aberrated, the aberrations of the lens should not be so high so as not to cause the product structure diffraction to overlap with the target image.

While the above description has referred to overlay as the parameter of interest, the concepts are more generally useful and relevant for other lithographic metrology applications (e.g., measuring a characteristic or parameter of interest such as overlay, focus, dose or one or more geometrical parameter values such as critical dimension, side wall angle, edge placement error or local critical dimension uniformity) on a target. Overlay may comprise a measure of misalignment of structures in different layers and/or within-layer overlay, i.e., a measure of misalignment of structures in a single layer, such as in a double patterning process.

Figure 7:
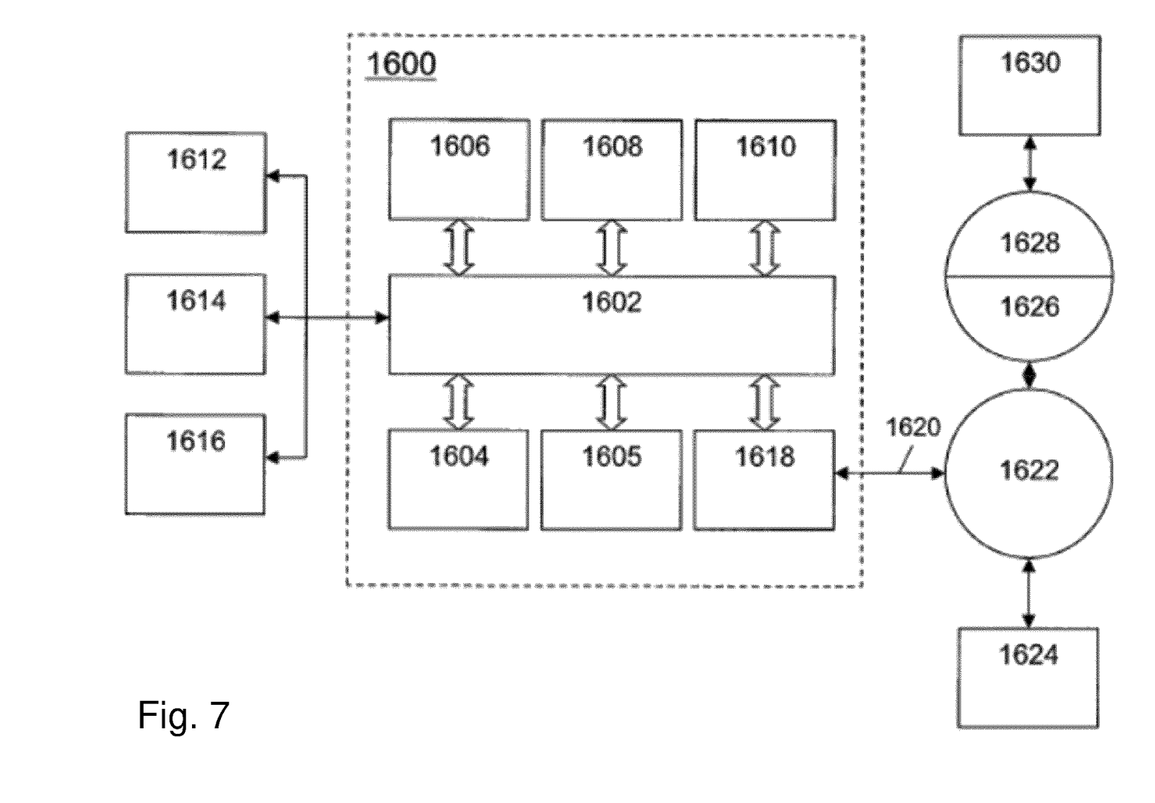
FIG. 7 is a block diagram illustrating a computer system which may assist in implementing methods according to embodiments of the invention.

FIG. 7 is a block diagram that illustrates a computer system 1600 that may assist in implementing the methods and flows disclosed herein. Computer system 1600 includes a bus 1602 or other communication mechanism for communicating information, and a processor 1604 (or multiple processors 1604 and 1605) coupled with bus 1602 for processing information. Computer system 1600 also includes a main memory 1606, such as a random access memory (RAM) or other dynamic storage device, coupled to bus 1602 for storing information and instructions to be executed by processor 1604. Main memory 1606 also may be used for storing temporary variables or other intermediate information during execution of instructions to be executed by processor 1604. Computer system 1600 further includes a read only memory (ROM) 1608 or other static storage device coupled to bus 1602 for storing static information and instructions for processor 1604. A storage device 1610, such as a magnetic disk or optical disk, is provided and coupled to bus 1602 for storing information and instructions.

Computer system 1600 may be coupled via bus 1602 to a display 1612, such as a cathode ray tube (CRT) or flat panel or touch panel display for displaying information to a computer user. An input device 1614, including alphanumeric and other keys, is coupled to bus 1602 for communicating information and command selections to processor 1604. Another type of user input device is cursor control 1616, such as a mouse, a trackball, or cursor direction keys for communicating direction information and command selections to processor 1604 and for controlling cursor movement on display 1612. This input device typically has two degrees of freedom in two axes, a first axis (e.g., x) and a second axis (e.g., y), that allows the device to specify positions in a plane. A touch panel (screen) display may also be used as an input device.

One or more of the methods as described herein may be performed by computer system 1600 in response to processor 1604 executing one or more sequences of one or more instructions contained in main memory 1606. Such instructions may be read into main memory 1606 from another computer-readable medium, such as storage device 1610. Execution of the sequences of instructions contained in main memory 1606 causes processor 1604 to perform the process steps described herein. One or more processors in a multi-processing arrangement may also be employed to execute the sequences of instructions contained in main memory 1606. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 1604 for execution. Such a medium may take many forms, including but not limited to, non-volatile media, volatile media, and transmission media. Non-volatile media include, for example, optical or magnetic disks, such as storage device 1610. Volatile media include dynamic memory, such as main memory 1606. Transmission media include coaxial cables, copper wire and fiber optics, including the wires that comprise bus 1602. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1604 for execution. For example, the instructions may initially be borne on a magnetic disk of a remote computer. The remote computer can load the instructions into its dynamic memory and send the instructions over a telephone line using a modem. A modem local to computer system 1600 can receive the data on the telephone line and use an infrared transmitter to convert the data to an infrared signal. An infrared detector coupled to bus 1602 can receive the data carried in the infrared signal and place the data on bus 1602. Bus 1602 carries the data to main memory 1606, from which processor 1604 retrieves and executes the instructions. The instructions received by main memory 1606 may optionally be stored on storage device 1610 either before or after execution by processor 1604.

Computer system 1600 also preferably includes a communication interface 1618 coupled to bus 1602. Communication interface 1618 provides a two-way data communication coupling to a network link 1620 that is connected to a local network 1622. For example, communication interface 1618 may be an integrated services digital network (ISDN) card or a modem to provide a data communication connection to a corresponding type of telephone line. As another example, communication interface 1618 may be a local area network (LAN) card to provide a data communication connection to a compatible LAN. Wireless links may also be implemented. In any such implementation, communication interface 1618 sends and receives electrical, electromagnetic or optical signals that carry digital data streams representing various types of information.

Network link 1620 typically provides data communication through one or more networks to other data devices. For example, network link 1620 may provide a connection through local network 1622 to a host computer 1624 or to data equipment operated by an Internet Service Provider (ISP) 1626. ISP 1626 in turn provides data communication services through the worldwide packet data communication network, now commonly referred to as the "Internet" 1628. Local network 1622 and Internet 1628 both use electrical, electromagnetic or optical signals that carry digital data streams. The signals through the various networks and the signals on network link 1620 and through communication interface 1618, which carry the digital data to and from computer system 1600, are exemplary forms of carrier waves transporting the information.

Computer system 1600 may send messages and receive data, including program code, through the network(s), network link 1620, and communication interface 1618. In the Internet example, a server 1630 might transmit a requested code for an application program through Internet 1628, ISP 1626, local network 1622 and communication interface 1618. One such downloaded application may provide for one or more of the techniques described herein, for example. The received code may be executed by processor 1604 as it is received, and/or stored in storage device 1610, or other non-volatile storage for later execution. In this manner, computer system 1600 may obtain application code in the form of a carrier wave.

Further embodiments are disclosed in the subsequent numbered clauses:

1. A method of measuring a structure comprising:
    obtaining an amplitude profile of scattered radiation relating to a measurement of a first structure on a first substrate;
    obtaining a reference phase profile relating to a reference measurement of at least one reference structure on a reference substrate, said at least one reference structure not being the same structure as said first structure; the at least one reference structure and the first structure being nominally identical in terms of at least a plurality of key parameters; and
    determining a complex-valued field to describe the first structure from the amplitude profile and reference phase profile.
2. A method as defined in clause 1, wherein the measurement of the first structure and the reference measurement are performed under the same measurement conditions.
3. A method as defined in clause 1 or 2, wherein the at least one reference structure was measured at a time preceding the measurement of a first structure, to determine the reference phase profile.
4. A method as defined in clause 3, wherein the reference measurement is performed in a reference phase and the reference phase profile obtained therefrom used in a plurality of subsequent measurements of a plurality of structures in addition to said first structure, to determine a complex-valued field for each of the plurality of structures, said plurality of structures being nominally identical to the at least one reference structure in terms of at least said plurality of key parameters.
5. A method as defined in any preceding clause, wherein the structure comprise a periodic grating structure and the key parameters include grating pitch, grating size and grating orientation.
6. A method as defined in any preceding clause, wherein the reference phase profile is obtained from a reference measurement of a plurality of reference structures, wherein phase profiles are determined for each said reference structures and are averaged to determine the reference phase profile.
7. A method as defined in any preceding clause, comprising:
aligning the amplitude profile with a reference amplitude profile relating to the reference measurement of the at least one reference structure, to obtain a registered amplitude template; and
applying the reference profile to the registered amplitude template to determine the complex-valued field.
8. A method as defined in any preceding clause, comprising performing an adjustment for an overlay induced global phase offset.
9. A method as defined in clause 8, wherein said performing an adjustment for an overlay induced global phase offset comprises optimizing in terms of the global phase offset, an image quality described by the complex-valued field.
10. A method as defined in any preceding clause, wherein said determining a complex-valued field comprises performing a correction to the complex-valued field to correct for aberrations in sensor optics used obtain said amplitude profile.
11. A method as defined in clause 10, wherein said performing a correction to the complex-valued field comprises the steps of:
Fourier transforming the complex-valued field to obtain a Fourier transformed complex-valued field; obtaining a conjugated lens aberration phase profile related to said aberrations in the sensor optics; and multiplying the conjugated lens aberration phase profile with the Fourier transformed complex-valued field.
12. A method as defined in clause 11, wherein said performing a correction to the complex-valued field further comprises:
digitally adjusting defocus aberration so as to maximize an image quality described by the corrected complex-valued field.
13. A method as defined in any preceding clause, comprising performing the measurement of the first structure by:
illuminating the first structure with measurement radiation;
capturing scattered radiation therefrom on a detector operable to detect an intensity profile of the scattered radiation; and
determining the amplitude profile from said intensity profile.
14. A method as defined in clause 13, wherein said capturing scattered radiation comprises capturing a single diffraction order.
15. A method as defined in any preceding clause, comprising:
measuring the at least one reference structure;
performing a phase retrieval to obtain said reference phase profile.
16. A method as defined in clause 15, wherein said measuring the at least one reference structure is comprises performing repeated captured with at least one parameter varied to provide sufficient information for the phase retrieval.
17. A computer program comprising program instructions operable to perform the method of any of clauses 1 to 16, when run on a suitable apparatus.
18. A non-transient computer program carrier comprising the computer program of clause 17.
19. A processing device operable to run the computer program of clause 17.
20. A metrology device being operable to perform the method of any of clauses 1 to 16.
21. A lithographic cell comprising:
the metrology device of clause 20, to perform measurements from which corrections are determined for a lithographic process; and
a lithographic apparatus operable to perform the lithographic process in accordance with said corrections.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of an inspection or metrology apparatus, embodiments of the invention may be used in other apparatus. Embodiments of the invention may form part of a mask inspection apparatus, a lithographic apparatus, or any apparatus that measures or processes an object such as a wafer (or other substrate) or mask (or other patterning device). The term "metrology apparatus" may also refer to an inspection apparatus or an inspection system. E.g. the inspection apparatus that comprises an embodiment of the invention may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference may have been made above to the use of embodiments of the invention in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. Further, pitch P of the metrology targets may be close to the resolution limit of the optical system of the scatterometer or may be smaller, but may be much larger than the dimension of typical product features made by lithographic process in the target portions C. In practice the lines and/or spaces of the overlay gratings within the target structures may be made to include smaller structures similar in dimension to the product features.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method comprising:
   obtaining an amplitude profile of scattered radiation relating to a measurement of a structure on a substrate;
   obtaining a reference phase profile relating to a reference measurement of at least one reference structure on a reference substrate, the at least one reference structure being a different structure than the structure, and the at least one reference structure and the structure being nominally identical in terms of at least a plurality of key parameters; and
   determining a complex-valued field to describe the structure from the amplitude profile and the reference phase profile.

2. The method of claim 1, wherein the measurement and the reference measurement are performed under same measurement conditions.

3. The method of claim 1, wherein the at least one reference structure was measured at a time preceding the measurement to determine the reference phase profile.

4. The method of claim 3, wherein the reference measurement is performed in a reference phase and the reference phase profile obtained therefrom is used in a plurality of subsequent measurements of a plurality of structures in addition to the structure, to determine a complex-valued field for each of the plurality of structures, the plurality of structures being nominally identical to the at least one reference structure in terms of at least the plurality of key parameters.

5. The method of claim 1, wherein:
   the structure comprises a periodic grating structure, and
   the key parameters include grating pitch, grating size, and grating orientation.

6. The method of claim 1, wherein:
   the reference phase profile is obtained from a reference measurement of a plurality of reference structures, and phase profiles are determined for each of the reference structures and are averaged to determine the reference phase profile.

7. The method of claim 1, comprising:
   aligning the amplitude profile with a reference amplitude profile relating to the reference measurement of the at least one reference structure, to obtain a registered amplitude template; and
   applying the reference profile to the registered amplitude template to determine the complex-valued field.

8. The method of claim 1, comprising:
   performing an adjustment for an overlay induced global phase offset,
   wherein the performing an adjustment for the overlay induced global phase offset comprises optimizing, in terms of the overlay induced global phase offset, an image quality described by the complex-valued field.

9. The method of claim 1, wherein:
   the determining the complex-valued field comprises performing a correction to the complex-valued field to correct for aberrations in sensor optics used to obtain the amplitude profile, and
   the performing the correction to the complex-valued field comprises:
      Fourier transforming the complex-valued field to obtain a Fourier transformed complex-valued field;
      obtaining a conjugated lens aberration phase profile related to the aberrations in the sensor optics; and
      multiplying the conjugated lens aberration phase profile with the Fourier transformed complex-valued field.

10. The method of claim 1, comprising performing the measurement of the structure by:
    illuminating the structure with measurement radiation;
    capturing scattered radiation therefrom on a detector operable to detect an intensity profile of the scattered radiation, the capturing comprising capturing a single diffraction order; and
    determining the amplitude profile from the intensity profile.

11. The method of claim 1, comprising:
    measuring the at least one reference structure; and
    performing a phase retrieval to obtain the reference phase profile.

12. The method of claim 11, wherein the measuring the at least one reference structure comprises performing repeated captures with at least one parameter varied to provide sufficient information for the phase retrieval.

13. A metrology device being operable to perform the method of claim 1.

14. A computer program comprising program instructions operable to perform operations comprising:
    obtaining an amplitude profile of scattered radiation relating to a measurement of a structure on a substrate;
    obtaining a reference phase profile relating to a reference measurement of at least one reference structure on a reference substrate, the at least one reference structure being a different structure than the structure, and the at least one reference structure and the structure being nominally identical in terms of at least a plurality of key parameters; and
    determining a complex-valued field to describe the structure from the amplitude profile and the reference phase profile.

15. A lithographic cell comprising:
    a metrology device operable to perform measurements from which corrections are determined for a lithographic process and operable to perform the measurements and the corrections by:

obtaining an amplitude profile of scattered radiation relating to a measurement of a structure on a substrate;

obtaining a reference phase profile relating to a reference measurement of at least one reference structure on a reference substrate, the at least one reference structure being a different structure than the structure, and the at least one reference structure and the structure being nominally identical in terms of at least a plurality of key parameters; and determining a complex-valued field to describe the structure from the amplitude profile and the reference phase profile; and a lithographic apparatus operable to perform the lithographic process in accordance with the corrections.

* * * * *